(12) United States Patent
Sakamoto et al.

(10) Patent No.: US 6,323,518 B1
(45) Date of Patent: Nov. 27, 2001

(54) INSULATED GATE TYPE SEMICONDUCTOR DEVICE AND METHOD OF MANUFACTURING THEREOF

(75) Inventors: Kozo Sakamoto, Hitachi; Yoshito Nakazawa; Eiji Yanokura, both of Takasaki, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/394,047

(22) Filed: Sep. 13, 1999

(30) Foreign Application Priority Data

Sep. 16, 1998 (JP) .................................................. 10-261713

(51) Int. Cl.⁷ .............................. H01L 23/62; H01L 29/76
(52) U.S. Cl. ............................................ 257/330; 257/355
(58) Field of Search ...................................... 257/355, 330

(56) References Cited

U.S. PATENT DOCUMENTS 5,298,442  3/1994  Bulucea et al. .
6,043,543 * 3/2000  Klose .
6,137,122 * 10/2000 Liaw et al. .
6,211,549 * 4/2001  Funaki et al. .

FOREIGN PATENT DOCUMENTS

19507146-A1 * 1/1996 (DE) .
63-229758     9/1988 (JP) .
4-17371       1/1992 (JP) .
9-82954       3/1997 (JP) .

* cited by examiner

*Primary Examiner*—Stephen D. Meier
(74) *Attorney, Agent, or Firm*—Mattingly, Stanger & Malur, P.C.

(57) ABSTRACT

Plural grooves are formed in a main surface of semiconductor layers on semiconductor substrate, and gate layers connected to a gate electrode are formed in the plural grooves through a gate insulating film, and then a body diffusion layer is formed between the gate layers, and afterwards, a source diffusion layer connected to a source electrode and a source diffusion layer connected to a source electrode are formed in an identical process.

23 Claims, 10 Drawing Sheets

US 6,323,518 B1

INSULATED GATE TYPE SEMICONDUCTOR DEVICE AND METHOD OF MANUFACTURING THEREOF

BACKGROUND OF THE INVENTION

The present invention relates to an insulated gate type semiconductor device having a protection element, and a method of manufacturing the device. Especially, the invention relates to an insulated gate semiconductor device which is suitable for forming a trench type insulated gate semiconductor element with a lateral type insulated gate semiconductor element or a polycrystalline silicon diode concerning an operation of the trench type insulated gate semiconductor element of in an identical chip, and a method of manufacturing the device.

For example, power MOSFET(Metal Oxide Semiconductor Field Effect Transistor) and IGBT (Insulated Gate Bipolar Transistor) are known as insulated gate type semiconductor elements. For improving a reliability and an added -value of the power MOSFET and the IGBT and for reducing a cost and a size of these semiconductor elements, in a case of forming these elements of power devices in a semiconductor substrate, an insulated gate type semiconductor device having a protection element such as a MOSFET with the power MOSFET and the IGBT in an identical chip is proposed. For example, a temperature detection circuit with a lateral type MOSFET and a polycrystalline silicon diode is formed in a drain region of a power MOSFET, using the manufacturing process of the planar type power MOSFET, as described in the Japanese Patent laid-open No. 63-229758. The temperature detection circuit turns off the power MOSFET, when the temperature of semiconductor chip is overheated over a pre-determined temperature.

The Japanese Patent laid-open discloses a polycrystalline silicon diode for preventing an electrostatic destruction between a gate and a source of a planar type power MOSFET in a chip of the planar type power MOSFET.

The trench type power MOSFET is proposed as an insulated gate type semiconductor element different from the planar type power MOSFET. In the trench type power MOSFET, a groove (trench) is formed in a semiconductor layer, and then a gate layer is formed in the groove through a gate oxide film, for reducing a power loss of the element. In addition, a channel width per unit area is lengthened by forming a channel in a side surface of the groove. In producing the trench type power MOSFET, a method of forming the groove after forming a source diffusion layer and a body (channel) diffusion layer is proposed, as described in the U.S. Pat. No. 5,298,442. On the other hand, a method of forming the source diffusion layer and the body (channel) diffusion layer after forming the groove is proposed, as described in Japanese Patent laid-open No. 4-17371. The former of these method is mainly adopted in general.

A method of forming the trench type power MOSFET and a FET protecting the power MOSFET on an identical chip is studied in Japanese Patent laid-open No. 9-82954. As the result, the method of using a gate buried in the trench as a gate of the FET protecting the trench type power MOSFET is proposed.

SUMMARY OF THE INVENTION

A method of forming a trench type power MOSFET and a FET protecting the trench type power MOSFET in an identical chip is disclosed in Japanese Patent laid-open No. 9-82954. In the laid-open, a general manufacturing method of forming a source diffusion layer of the trench type power MOSFET before forming the groove is used. Since a lateral type MOSFET using a side surface of the groove-gate buried in the trench is used for a protection circuit, the source region of the lateral MOSFET is formed simultaneously with the source region of the trench type power MOSFET. Therefore, it is advantageous that the mask for forming the source diffusion layer of the lateral type MOSFET for the protection circuit is unnecessary. However, it is a problem that the element area increases to lengthen the gate width W, because only a part of the side surface of the groove-gate buried in the trench is used as the gate of the lateral type MOSFET for the protection circuit. In addition, it is another problem that a gate-to-source capacitance increases, because the body region, which is formed in a bottom of the groove-gate through a gate oxide film, is connected to the source.

A general manufacturing method of forming a source diffusion layer of a trench type power MOSFET before forming a groove is disclosed in the U.S. Pat. No. 5,298,442. In applying the manufacturing method of the built-in of a conventional lateral MOSFET having a source diffusion layer and a drain diffusion layer in self-alignment to a gate as disclosed in Japanese Patent laid-open No. 63-229758, a mask for forming the source diffusion layer of the lateral type MOSFET is necessary. Therefore, it is a problem that the manufacturing cost rises. In addition, the source diffusion layer of the trench type power MOSFET and the source diffusion layer of the lateral MOSFET are formed before forming the groove. Therefore, there is a problem that it is difficult to make shallow the source diffusion layer and the channel diffusion layer of the trench type power MOSFET and the source diffusion layer of the lateral type MOSFET, because of a process, which is generally applied for forming a groove, of forming a sacrifice oxide film in high temperature and long time. Therefore, it is a problem that reduction of gate-to-source capacitance of the trench type power MOSFET, reduction of power loss with shortening channel-length, and reduction of gate-to-source capacitance of the lateral type MOSFET are difficult.

On the other hand, in regard to a method of forming a trench type power MOSFET with a diode protecting a gate of the power MOSFET from an electrostatic destruction in an identical chip, study for reducing masks to the utmost with considering power loss reduction of the power MOSFET and prevention of increase of the gate-to-source capacitance of the power MOSFET is not sufficient.

An object of the invention is to present an insulated gate type semiconductor device in which improving a performance is possible, even if a trench type insulated gate semiconductor element is formed with a lateral insulated gate semiconductor element or a polycrystalline silicon diode in an identical chip.

Another object of the invention is to present a method of manufacturing an insulated gate type semiconductor device in which reducing process steps in forming a trench type insulated gate semiconductor element with a lateral type insulated gate semiconductor element or a polycrystalline silicon diode in an identical chip is possible.

For achieving the object, an insulated gate type semiconductor device according to the invention has a trench type insulated gate semiconductor element, and a lateral type insulated gate semiconductor element concerning an operation of the trench type insulated gate semiconductor element. In a main surface of a semiconductor layer on a semiconductor substrate in the trench type insulated gate semiconductor element, a plurality of grooves are provided. In the grooves, gate layers connected to a first electrode are provided through gate insulating films. In a surface opposite to the main surface of the semiconductor layer, a second electrode is provided. A diffusion layer connected to a third electrode is provided between gate layers. A main gate layer connected to a gate electrode in the main surface of a semiconductor layer on the semiconductor substrate of the lateral type insulated gate semiconductor element is provided through a gate insulating film. In regions of the semiconductor layer between which a region facing the main gate layer is put, a drain diffusion layer connected to a drain electrode and a source diffusion layer connected to a source electrode are provided. A depth of the diffusion layer connected to the third electrode is not greater than a depth of the source diffusion layer in the lateral type insulated gate semiconductor element.

In constituting the aforementioned insulated gate type semiconductor device, it is possible to add following elements.

(1) The gate insulating film of the trench type insulated gate semiconductor element is formed in thicker than the gate insulating film of the lateral type insulated gate semiconductor element.

(2) An insulating film is provided in the main surface of the semiconductor layer on the semiconductor substrate. Plural silicon layers, having different conductivity types and thickness less than the gate layer of the lateral type insulated gate semiconductor element, are provided on the insulating film as a diode.

(3) An insulating film is provided in the main surface of the semiconductor layer on the semiconductor substrate. A silicon layer, having thickness less than the gate layer of the lateral type insulated gate semiconductor element, is provided on the insulating film as a resistor.

(4) An insulating film is provided in the main surface of the semiconductor layer on the semiconductor substrate. A silicon layer, having thickness less than the gate layer of the lateral type insulated gate semiconductor element, is provided on the insulating film as a capacitor. An electrode connected to the gate layer of the lateral type insulated gate semiconductor element and an electrode connected to the silicon layer are electrodes of the capacitor.

(5) An overcurrent detection- protection circuit, which suppresses output current of the trench type insulated gate semiconductor element at excessive change of the output current value of the trench type insulated gate semiconductor element, is provided. The overcurrent detection- protection circuit having a main element of the lateral type insulated gate semiconductor element is provided in the semiconductor substrate.

(6) A temperature detection- protection circuit, which suppresses output current of the trench type insulated gate semiconductor element at a temperature of the semiconductor layer not less than a regulation temperature. The temperature detection-protection circuit having a main element of the lateral type insulated gate semiconductor element is provided in the semiconductor substrate.

(7) The trench type insulated gate semiconductor element is a MOSFET. The MOSFET has plural grooves provided in the main surface of the semiconductor layer of the semiconductor substrate. In the grooves, the gate layer connected to a gate electrode is provided through the gate insulating film. A drain electrode is provided in a surface opposite to the main surface of the semiconductor layer. Between each gate layer, a source diffusion layer connected to a source electrode is provided. A depth of the source diffusion layer connected to the source electrode is not greater than a depth of the source diffusion layer in the lateral type insulated gate semiconductor element.

(8) In the trench type insulated gate semiconductor element, plural grooves are provided in the main surface of the semiconductor layer of the semiconductor substrate. In the grooves, the gate layer connected to a gate electrode is provided through the gate insulating film. A collector electrode is provided in a surface opposite to the main surface of the semiconductor layer. Between each gate layer, a emitter diffusion layer connected to an emitter electrode is provided. A depth of the emitter diffusion layer is not greater than a depth of the source diffusion layer in the lateral type insulated gate semiconductor element.

For achieving the aforementioned object, another insulated gate type semiconductor device according to the invention has a trench type insulated gate type semiconductor element, and a diode concerning a gate-protection of the trench type insulated gate semiconductor element. In the trench type insulated gate semiconductor element, plural grooves are provided in a main surface of a semiconductor layer of a semiconductor substrate. Inside and outside the grooves, a gate layer connected to a first electrode is provided through a gate insulating film. A second electrode is provided in a surface opposite to the main surface of the semiconductor layer. Between each gate layer, a diffusion layer connected to a third electrode is provided. The gate layer has a gate layer region on the grooves and a gate layer region extending outside the grooves. The gate layer is connected to the first electrode on the gate layer region extending outside the grooves. The diode is provided on an insulating film provided in the main surface of the semiconductor layer of the semiconductor substrate. A film-thickness of the diode is less than a film-thickness of the gate layer region extending outside the grooves to connect the first electrode with the gate layer.

For achieving another object, a method of manufacturing a insulated gate semiconductor device has forming plural grooves in a main surface of a semiconductor layer of a semiconductor substrate, forming a gate layer in the grooves through a gate insulating film, forming a body diffusion layer between each gate, and , after that, forming a diffusion layer connected to a third electrode.

In the aforementioned method of manufacturing, it is possible to add following elements.

(1) The plural grooves are formed in the main surface of the semiconductor layer of the semiconductor substrate. In the grooves, the gate layer connected to the first electrode is formed through the gate insulating film. Between each gate layer, a body diffusion layer is formed. After that, the diffusion layer connected to the third electrode is formed, and a source diffusion layer of a lateral type insulated gate semiconductor element is formed by the identical process of forming the diffusion layer.

(2) A gate layer of the lateral type insulated gate semiconductor element is formed by the identical process of forming the gate layer of the trench type insulated gate semiconductor element.

(3) The plural grooves are formed in the main surface of the semiconductor layer of the semiconductor substrate. In the grooves, the gate layer connected to the first electrode is formed through the gate insulating film. Between each gate layer, the body diffusion layer is formed. After that, the diffusion layer connected to the third electrode is formed, and a cathode layer or an anode layer of a diode is formed by the identical process of forming the diffusion layer.

A power switch system according to the invention has an insulated gate type semiconductor device, as a driving force which drives a load, including a overcurrent detection-protection circuit or a temperature detection-protection circuit. By this system, output current of the trench type insulated gate semiconductor element is suppressed in the case in which output current value of the trench type insulated gate semiconductor element becomes excessive with the overload or case in which the temperature of the semiconductor layer increases over a pre-determined temperature.

According to the above mentioned means, the depth of the diffusion layer connected to the third electrodes of the trench type insulated gate semiconductor element is not greater than the depth of source diffusion layer of the lateral type insulated gate semiconductor element, when the trench type insulated gate semiconductor element and the lateral type insulated gate semiconductor element are formed on the identical chip. Therefore, the capacity between electrodes (between gate and source) is reduced. And, it is possible to easily make large the mutual conductance of the lateral type insulated gate semiconductor element, and effective channel-length of the lateral type insulated gate semiconductor element is reduced. Therefore, it is fined, and the chip area is reduced. In addition, it is possible to form diffusion layer connected to the third electrodes of the trench type insulated gate semiconductor element and diffusion layer for the cathode of the diode by the identical process, because film thickness of the diode is less than the film thickness of gate layer region of insulated gate semiconductor element, when the trench type insulated gate semiconductor element and diode are formed on the identical chip. Therefore, the use of the trench type insulated gate semiconductor element which has little loss and small input capacitance is possible, while the process cost is reduced. The performance of the insulated gate type semiconductor device is improved.

It is prevented that the depth of each diffusion layer becomes large by high temperature and long-time oxidation process in forming the groove, because, in forming the trench type insulated gate semiconductor element and the lateral type insulated gate semiconductor element on the identical chip, body diffusion layer and diffusion layer connected to the third electrodes are formed in the groove, after the groove is formed in the main surface of semiconductor layer. Therefore, the channel-length of the trench type insulated gate semiconductor element is reduced, while the capacity between electrodes (gate and source) is reduced. Consequently, the loss is reduced.

Additionally, the number of the mask and the number of process are reduced, because a source diffusion layer of the lateral type insulated gate type semiconductor element and a diffusion layer connected to the third electrodes in each groove are formed by the identical process, after plural grooves are formed in main surface of the semiconductor layer. Therefore, the manufacturing cost (the process cost) is reduced.

DESCRIPTION OF THE PREFERRED EMBODIMENTS

The embodiments of the invention are explained based on the drawings.

Embodiment 1

Figure 1:
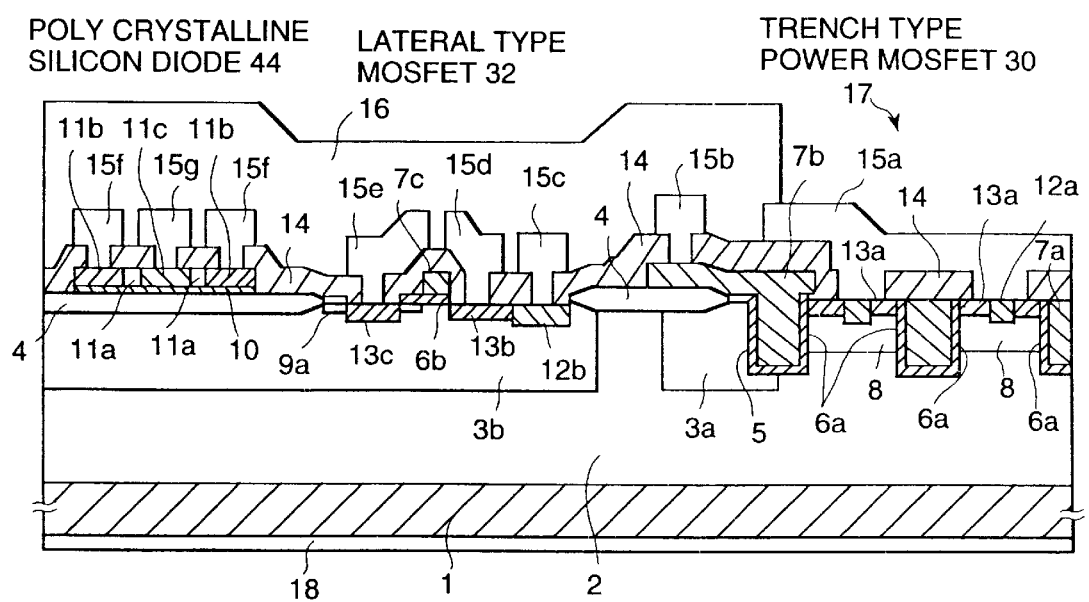
FIG. 1 is a longitudinal cross section showing the first embodiment of the invention.
Figure 2:
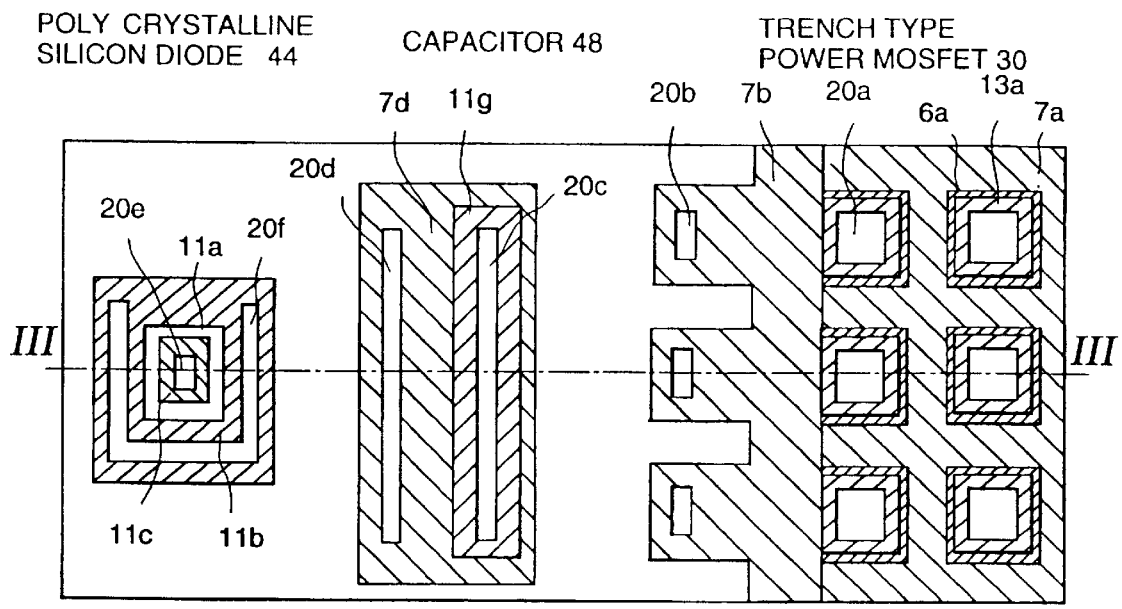
FIG. 2 is a main plane view showing the first embodiment of the invention.
Figure 3:
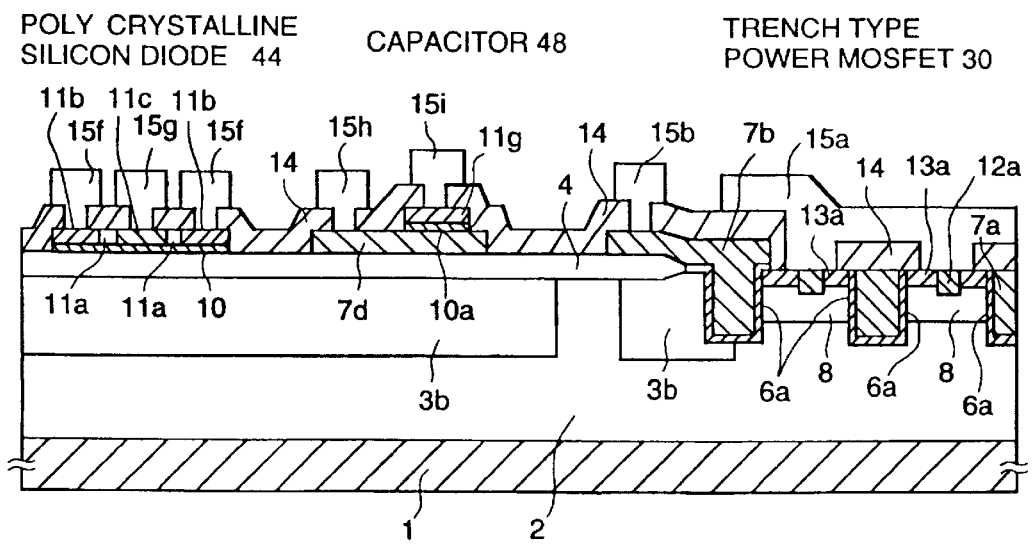
FIG. 3 is a sectional view along a—a line in FIG. 2.
Figure 4:
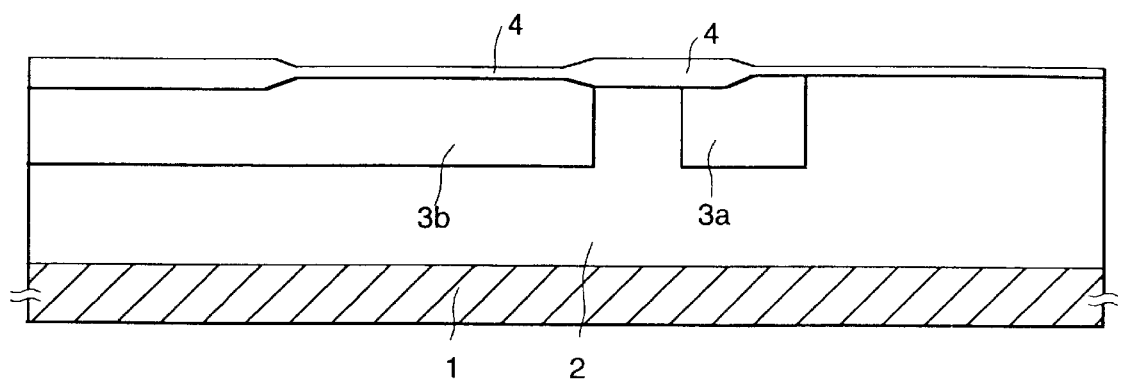
FIGS. 4(a)–(b) is a sectional view for explaining a method of manufacturing a semiconductor device according to the invention.
Figure 4:
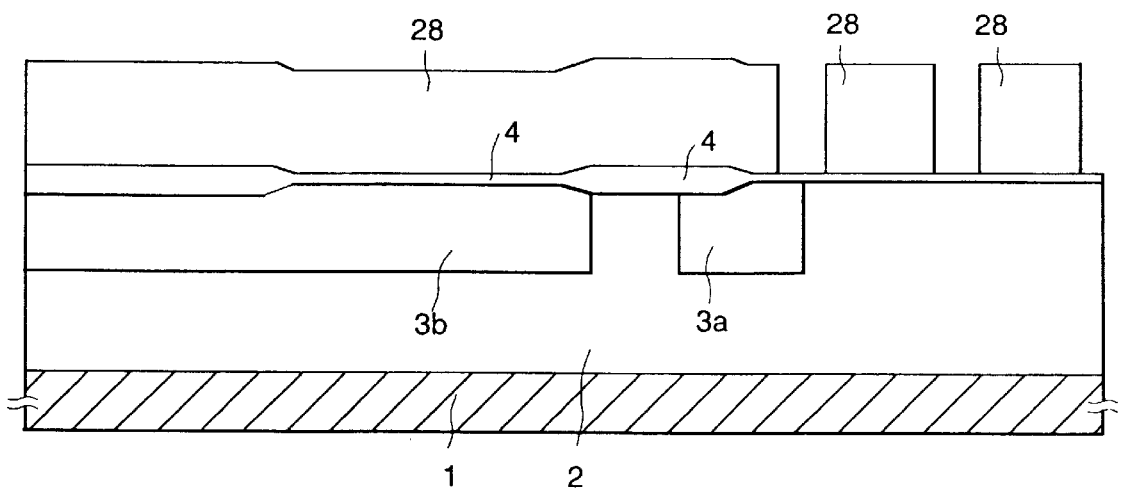
Figure 5:
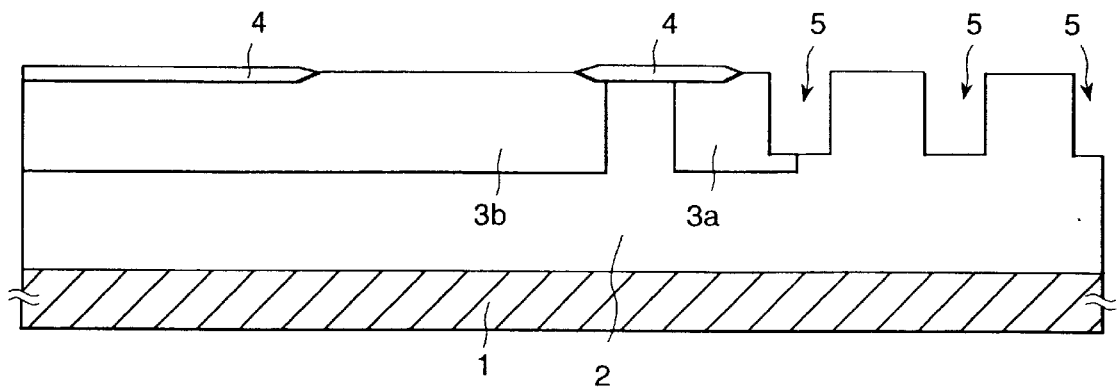
FIGS. 5(a)–(c) is a sectional view for explaining a method of manufacturing a semiconductor device according to the invention.
Figure 5:
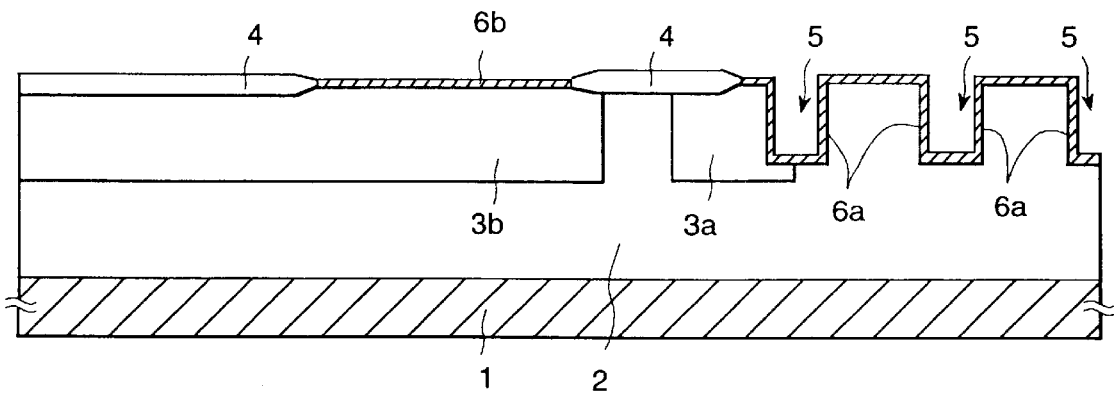
Figure 5:
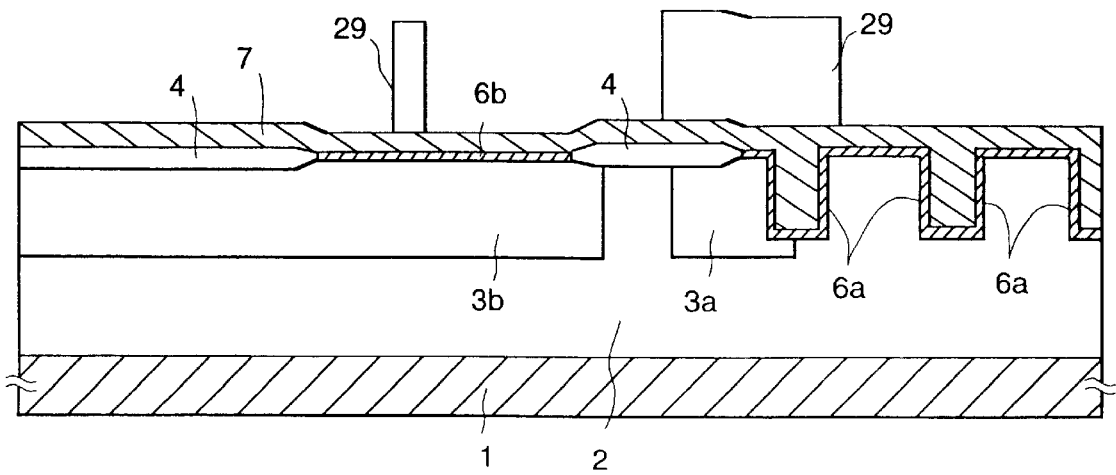
Figure 6:
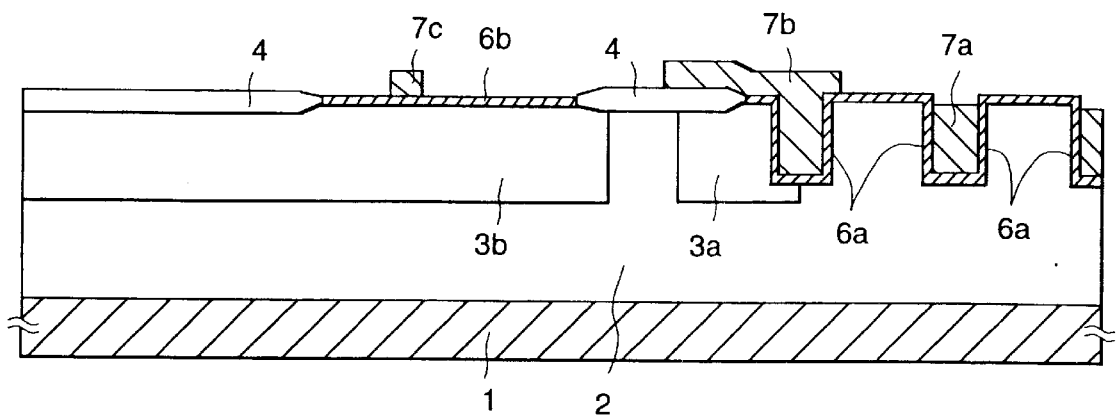
FIGS. 6(a)–(c) is a sectional view for explaining a method of manufacturing a semiconductor device according to the invention.
Figure 6:
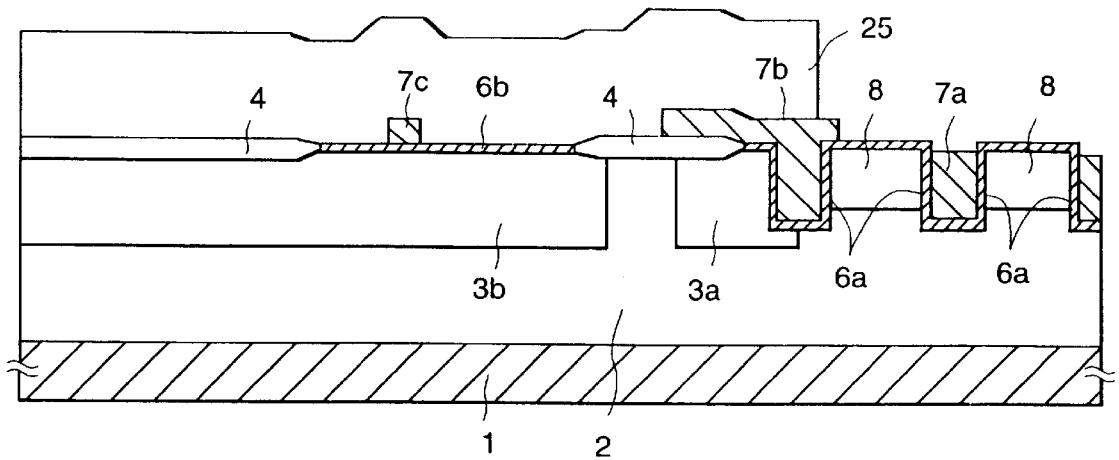
Figure 6:
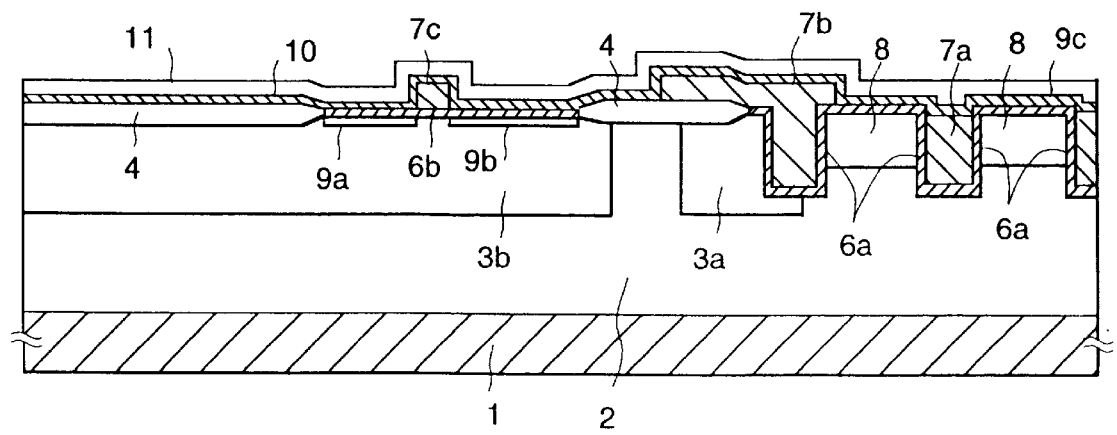
Figure 7:
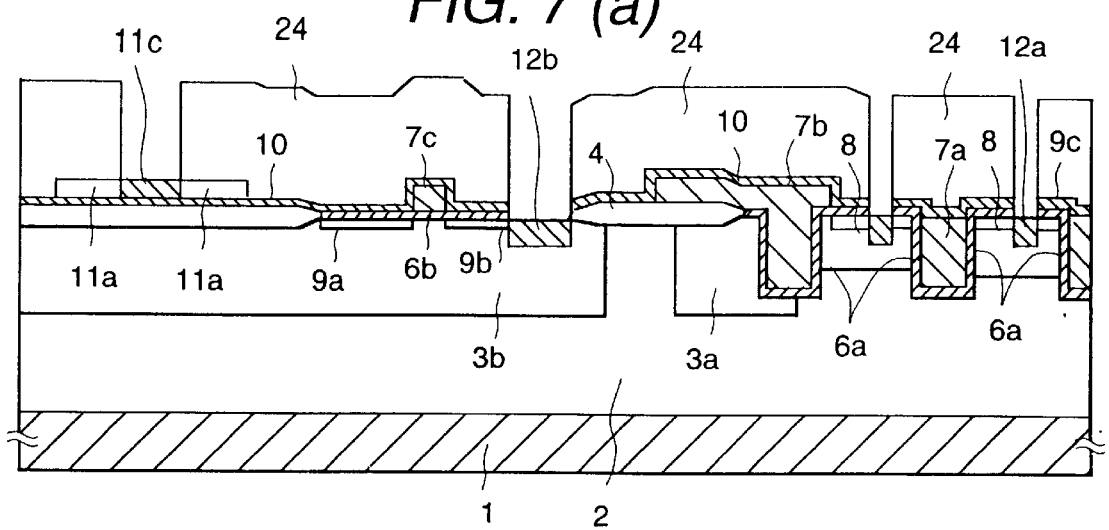
FIGS. 7(a)–(c) is a sectional view for explaining a method of manufacturing a semiconductor device according to the invention.
Figure 7:
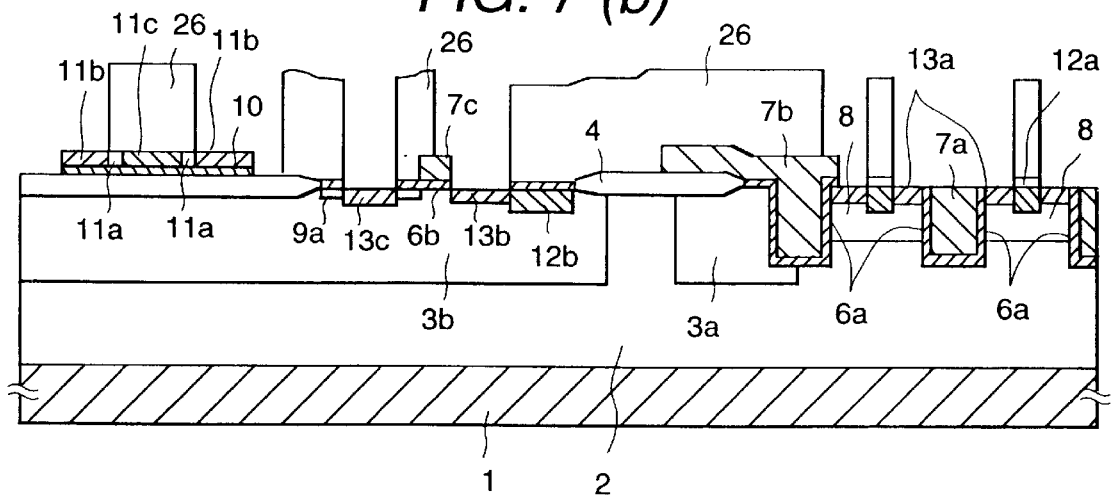
Figure 7:
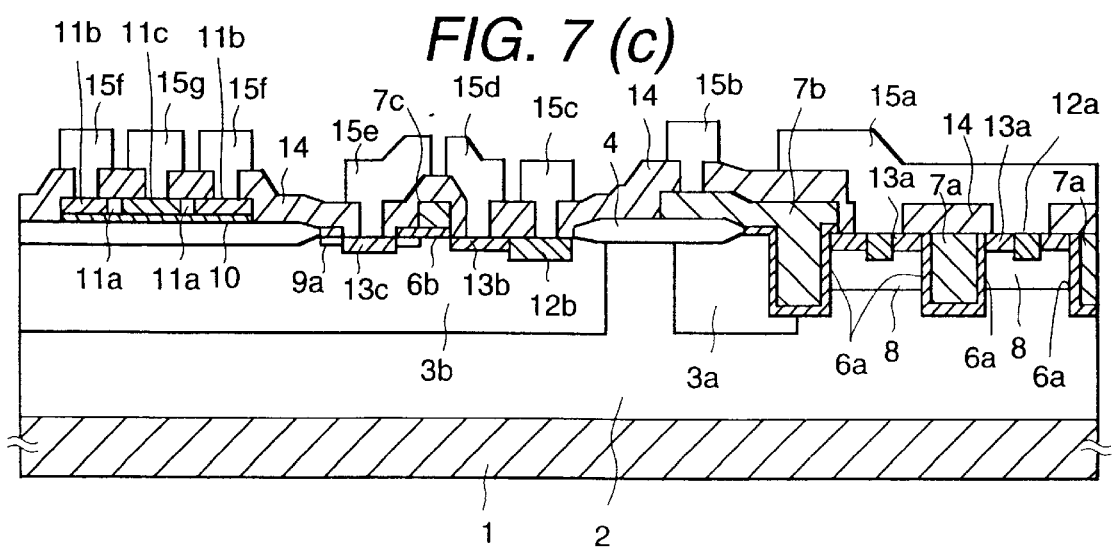

FIG. 1 is a longitudinal section drawing of an insulated gate type semiconductor device with protection circuit of the first embodiment of the invention. FIG. 2 is main plane section of the insulated gate type semiconductor device with protection circuit. FIG. 3 is a longitudinal section along a—a line of FIG. 2.

For example, the insulated gate type semiconductor device has a trench type power MOSFET 30 in FIG. 1 or FIG. 3 as an insulated gate type power semiconductor element. For example, the semiconductor device has a lateral type MOSFET 32 as a lateral type insulated gate type semiconductor element for controlling operation of the FET 30 and protecting FET 30, which is an element concerning an operation of the FET 30 such as the protection operation. In addition, the semiconductor device has polycrystalline silicon diode 44, capacitors 48, resistor (omission of illustration) as circuit element for protecting the trench type power MOSFET 30 with the lateral type MOSFET 32. These elements are formed on an identical chip.

Concretely, n type epitaxial layer 2 and p type well 3a and 3b are formed on a high impurity density n type substrate (semiconductor substrate) 1 as semiconductor layers. In a main surface of the semiconductor layers, oxide film 4 and plural grooves (trench) 5 are formed. In each groove 5, polycrystalline silicon layers (gate layer) 7a and 7b are formed through a gate oxide film (gate insulator) 6a. On the polycrystalline silicon layer 7b, a gate electrode 15b as a first electrode of the trench type power MOSFET 30 are formed through an oxide film 14. A source electrode 15a as a third electrode of the FET 30 is formed on polycrystalline silicon layer 7a through the oxide film 14. Between each groove 5, a body (channel) diffusion layer 8 and a high impurity density p type diffusion layer 12a and a source diffusion layer 13a (high impurity density n type diffusion layer) are formed. A drain electrode of a second electrode of the FET 30 is formed as a back surface electrode 18 in a back surface side of substrate 1.

A polycrystalline silicon layer (main gate layer) 7c connected to the gate electrode through a gate oxide film 6b in the main surface of semiconductor layer are formed as the lateral type MOSFET 32. A drain diffusion layer 13c connected to a drain electrode 15e and a source diffusion layer 13b connected to a source electrode 15d are formed in the p type well 3b. A region in the p type well 3b facing to the polycrystalline layer 7c is put between the drain diffusion layer 13c and the source diffusion layer 13b. A high impurity density p type body region 12b adjacent to the source diffusion layer 13b are formed for ohmic contact of p type diffusion layer 3b of a body region and a body aluminum electrode 15c.

Though the polycrystalline silicon layer 7a and the polycrystalline silicon layer 7b are separated in the Figure, the polycrystalline silicon layer 7b for gate of the FET 30 is buried in a grating-like silicon groove, as it is shown in FIG. 2. Therefore, the polycrystalline silicon layers 7a and 7b are connected in other cross section. A contact region 20a is provided in order to connect the source electrode 15a and the source diffusion layer 13a and source region 12b. A contact region 20b is provided in order to connect the gate aluminum electrode 15b with the polycrystalline silicon layer 7b for the gate.

On the semiconductor layer of the FET 30, 32 circumference, a polycrystalline silicon diode 44 and a capacitor 48 and a resistor (omission of illustration) are formed as through the oxide film 4 which is thicker than gate oxide films 6a, 6b. In the polycrystalline silicon diode 44, a p type impurity region 11c in a central part and a low-density p type impurity region 11a in the peripheral part are formed. In addition, a high impurity density n type region 11b are formed in the circumference. This polycrystalline silicon diode has the plainness of the ring. It is an advantage that the diode has no characteristic degradation of blocking voltage, etc., because a pn junction diode is not formed in the edge portion in silicon layer. Still, a contact region 20e is formed as a region for connecting a p type diffusion layer 11c with an anode electrode (aluminum electrode) 15g. A contact region 20f is formed as a region for connecting a p type diffusion layer 11b with a cathode electrode (aluminum electrode) of 15f.

The capacitor 48 has a polycrystalline silicon layer 7d formed by patterning of an after mentioned first polycrystalline silicon layer (first silicon layer) 7, a polycrystalline silicon layer 11d formed by patterning of a second polycrystalline silicon layer (second silicon layer) 11, and an oxide film 10a formed between these two polycrystalline silicon layer 7d and 11d (a part of an oxide film 10 formed on an oxide film 4). The polycrystalline silicon layer 7d is connected to an aluminum electrode 15h through a contact region 20d. A polycrystalline silicon layer 11g is connected to an aluminum electrode 15i through a contact region 20c.

A method of manufacturing an insulated gate type semiconductor device with protection circuit according to the invention is explained in FIGS. 3–7.

A n type epitaxial layer 2 having resistivity of about 1 Ωcm and thickness of about 7 μm is grown on a high impurity density n type substrate 1 having arsenic concentration of about $2 \times 10^{19} cm^{-3}$, as shown in FIG. 4(a). Afterwards, ion implantation of boron of about $2 \times 10^{13} cm^{-2}$ is done, and then, p type wells 3a and 3b of about 2 μm depth are diffused in the semiconductor crystal (semiconductor layer). Afterwards, surface oxidation is done, and an oxide film 4 of about 30 nm thickness is formed. In addition, selective oxidation is carried out, while a nitride film (omission of illustration) is placed as an antioxidation mask. Afterwards, the nitride film is removed. The thin oxide film 4 of about 30 nm in an active region for forming a FET is formed. In a field region for forming a polycrystalline silicon diode and a capacitor and a resistor, a thick oxide film 4 of about 100 nm thickness is formed.

Next, the oxide film 4 is thickened by piling up oxide film of about 30 nm in the full face of the active region and field region, as shown in FIG. 4(b). Afterwards, patterning of a photoresist 28 is done in order to form a silicon groove.

Next, using the photoresist 28 as a mask, the oxide film 4 is selectively etched. Afterwards, using the pattern of the oxide film 4 as a mask, a groove (trench) 5 of about 2 μm depth is formed by dry etching after photoresist of 28 is removed, as shown in FIG. 5(c). Afterwards, A silicon layer (p type well 3b) in the active region of a lateral type MOSFET 32 is exposed by oxide film etching of full face (a main surface and a back surface of the semiconductor layer). In addition, a sacrifice oxide film is formed during long time under high temperature. Afterwards, the shape of the groove (silicon groove) 5 changes to a shape for forming a gate oxide film of uniform thickness with smoothing of the corner of groove 5 by removal of the oxide film.

Next, a gate oxide film 6a for the trench type power MOSFET 30 in a wall surface (side and bottom surface) of the silicon groove of 5 and a gate oxide film 6b for the lateral type MOSFET 32 on the p type well 3b are formed at about 80 nm thickness by gate oxidation for the active region, as shown in FIG. 5(d).

Next, a polycrystalline silicon layer in which phosphorus is doped is piled up on the gate oxide films 6a, 6b so that the surfaces of these gate oxide films become a flat, as shown in FIG. 5(e). Afterwards, patterning of an etching region of the polycrystalline silicon layer 7 is done by a photoresist 29.

Next, the etch backward using the photoresist 29 as a mask does the patterning of the polycrystalline silicon layers 7a, 7b for the gate electrode of the power MOSFET 30 and the polycrystalline silicon layer 7c of about 1 μm thickness for the gate electrode of the lateral type MOSFET 32, as shown in FIG. 6(f). In this case, the patterning of the polycrystalline silicon layer 7b is deeply done than the polycrystalline silicon layer 7a, since the polycrystalline silicon layer 7b is connected for gate electrode 15b.

Next, a p type diffusion layer 8 (body diffusion layer) as a body (channel) of the trench type power MOSFET 30 are formed using the mask of polycrystalline silicon layers 7a and 7b and a photoresist 25 by ion implantation of the boron of about $4 \times 10^{13} cm^{-2}$, as shown in FIG. 6(g).

Next, the p type diffusion layer 8 is extended at about 1.5 μm depth by diffusion after a photoresist 25 is removed, as shown in FIG. 6(h). Afterwards, ion implantation of the phosphorus of about $5 \times 10^{12} cm^{-2}$ is done in the full face in order to form a low impurity density n type offset layer 9a necessary for improvement of drain blocking voltage of the lateral type MOSFET 32. Though low-impurity density n type diffusion layers 9b and 9c are simultaneously formed, these diffusion region 9b and 9c substantially disappear in the formation of a high impurity density layer afterwards. Afterwards, an oxide film 10 of about 50 nm thickness and a polycrystalline silicon layer 11 about 250 nm thickness are piled up.

Next, a low impurity density p type region 11a of a polycrystalline silicon diode 44 and a polycrystalline silicon resistor (omission of illustration) having high resistivity are formed by ion implantation of boron in the polycrystalline silicon layer 11. Afterwards, ion implantation of boron of about $1 \times 10^{15} \text{cm}^{-2}$ is done using a mask of photoresist 24, as shown in FIG. 7(i). Simultaneously, a high impurity density p type diffusion layers 12a and 12b of about 40 nm depth are formed by this ion implantation as p type body contact diffusion layers of the trench type power MOSFET 30 and the lateral type MOSFET 32. Simultaneously, a high impurity density anode region 11c of the polycrystalline silicon diode 44 is formed.

Simultaneously, a source diffusion layer 13a of the trench type power MOSFET 30 and a source diffusion layer 13b of the lateral type MOSFET 32 and a drain diffusion layer 13c are respectively formed using a mask of a photoresist 26 by the arsenic ion implantation of about $5 \times 10^{13} \text{cm}^{-2}$ at about 30 nm depth, as shown in FIG. 7(j). A high impurity density cathode region 11b of the polycrystalline silicon diode 44 is also formed at this time.

Next, an oxide film 14 of about 500 nm is piled up, as shown in FIG. 7(k). Then, the contact region is formed. In addition, a source electrode 15a and a gate electrode 15b of the trench type power MOSFET 30, a source electrode 15d and a body electrode 15c and a drain electrode 16e of the lateral type MOSFET 32, and a cathode electrode 15f and an anode electrode 15g of the polycrystalline silicon diode 44 are formed.

Afterwards, a protective film 16 is formed on the each electrode, as shown in FIG. 1. Then, contact windows of a source pad 17 etc. of the FET 30 are opened. In addition, a back surface electrode 18 is formed after etching of back surface of a semiconductor chip (substrate 1) as a drain electrode.

Simultaneously, the source diffusion layer 13a of the trench type power MOSFET 30 and the source diffusion layer 13b of the lateral type MOSFET 32 are formed after a process for filling up the groove 5 according to the embodiment. Or, source-body junction depth (depth of the source diffusion layer) of the source diffusion layer 13a is not greater than the depth of the source diffusion layer 13b. That is to say, the diffusion layer having impurity density grater than a body diffusion layer 12b (source region) of the lateral type MOSFET 32 is used as a body diffusion layer 8, because threshold voltage of the trench type power MOSFET 30 is set higher than threshold voltage of the lateral type MOSFET 32 generally. Therefore, the source-body junction in the source diffusion layer 13a is shallower than the source-body junction of the source diffusion layer 13b. However, the depth of the junction of both (source diffusion layer 13a, 13b) is equalized, when the p type diffusion layer having the same impurity density is used at the body diffusion layer 12b and 8.

Like this, the number of manufacturing process and manufacturing cost (process cost) are reduced by the simultaneous formation after the trench groove formation process of the source diffusion layer 13a and 13b, because the mask for the source formation is settled with 1 sheet.

In addition, the source diffusion layers 13a, 13b and the body diffusion layers 8, 12b are formed after the trench groove formation process including the process of forming sacrifice oxide film during many hours under high temperature according to the embodiment. Therefore, the source diffusion layers 13a, 13b and the body diffusion layer 8, 12b become shallow. In addition, the source diffusion layer 13b and a low impurity density n type offset layer 9 for the drain are formed in self-alignment for the poly-crystalline silicon gate electrode 7c. Therefore, mutual conductance gm rises and a effective channel-length (width of the polycrystalline silicon layer 7c) becomes short. Consequently, fining the lateral type MOSFET 32 and cost reduction by reduction in chip area become possible. And, a capacity between gate and source is reduced, because the source diffusion layers 13a and 13b become shallow. Especially, on the trench type power MOSFET 30, making into low-loss becomes possible, because the capacity between gate and source can be reduced and the channel-length shortens.

A blocking characteristics are stabilized according to the embodiment, because the thickness of silicon layers (11a~11c) in the polycrystalline silicon diode 44 is thinner than the silicon layer 7c in the gate of the lateral type MOSFET 32.

The thickness about 25 nm of the silicon layers 11a~11c in the polycrystalline silicon diode 44, while the thickness of the silicon layer 7c in the lateral type MOSFET 32 is about 100 nm. Therefore, the blocking characteristics of the polycrystalline silicon diode 44 are stabilized.

This reasons are as follows. The silicon layer 7c connected to the gate electrode of the lateral type MOSFET 32 is flattened, after the polycrystalline silicon layer 7 is embedded in the groove 5 of the trench type power MOSFET 30. Therefore, it is desirable that the polycrystalline silicon layer 7c of the lateral type MOSFET 32 is formed at the thickness over about 50 nm. In the meantime, the film thickness of silicon layers (11a~11c) of the polycrystalline silicon diode 44 is thin such as about 40 nm or less. Therefore, these diffusion layers 11b and 11c are formed to the bottom of the polycrystalline silicon layer 11 by the identical process of forming the diffusion layer 13a, 13b and the body diffusion layer 8, when the n type cathode diffusion layer 11b and the p type anode diffusion layer 11c are formed. Since the electric field in the polycrystalline silicon diode 44 is constant for depth direction by this, the blocking characteristics of the polycrystalline silicon diode 44 are stabilized. And, the fluctuation of junction area which effectively operates becomes difficult to receive the influence by the fluctuation of the thickness of silicon layer 11. Therefore, the accuracy of the temperature detection control circuit rises using temperature change of forward voltage of the polycrystalline silicon diode 44 or temperature change of reverse-directional leakage current of polycrystalline silicon diode of 44, when for example, the temperature detection control circuit is constituted.

In addition, the polycrystalline silicon layer 11a can be also used for a high resistive element using polycrystalline silicon. Therefore, the resistive element of which sheet resistivity is large even in high impurity density is realized by making the thickness of the silicon layer 11a over 16% thinner than the thickness of the polycrystalline silicon layer 7c. Therefore, the accuracy of the absolute resistor value is improved, if such resistive element is used, and in addition, the fluctuation of the resistance value by the temperature decreases.

Simultaneously, the source diffusion layers 13a and 13b are formed according to the embodiment. Doping impurity to a cathode region 11f of the polycrystalline silicon diode 44(45,46) and a polycrystalline silicon resistor is done with formation of the source diffusion layers of 13a and 13b. Additionally, doping impurity to the anode region 11c of the polycrystalline silicon diode 44 and the polycrystalline silicon resistor is carried out with formation of the diffusion layer 12a for a p type body contact. Therefore, the process cost is reduced.

Embodiment 2

Figure 8:
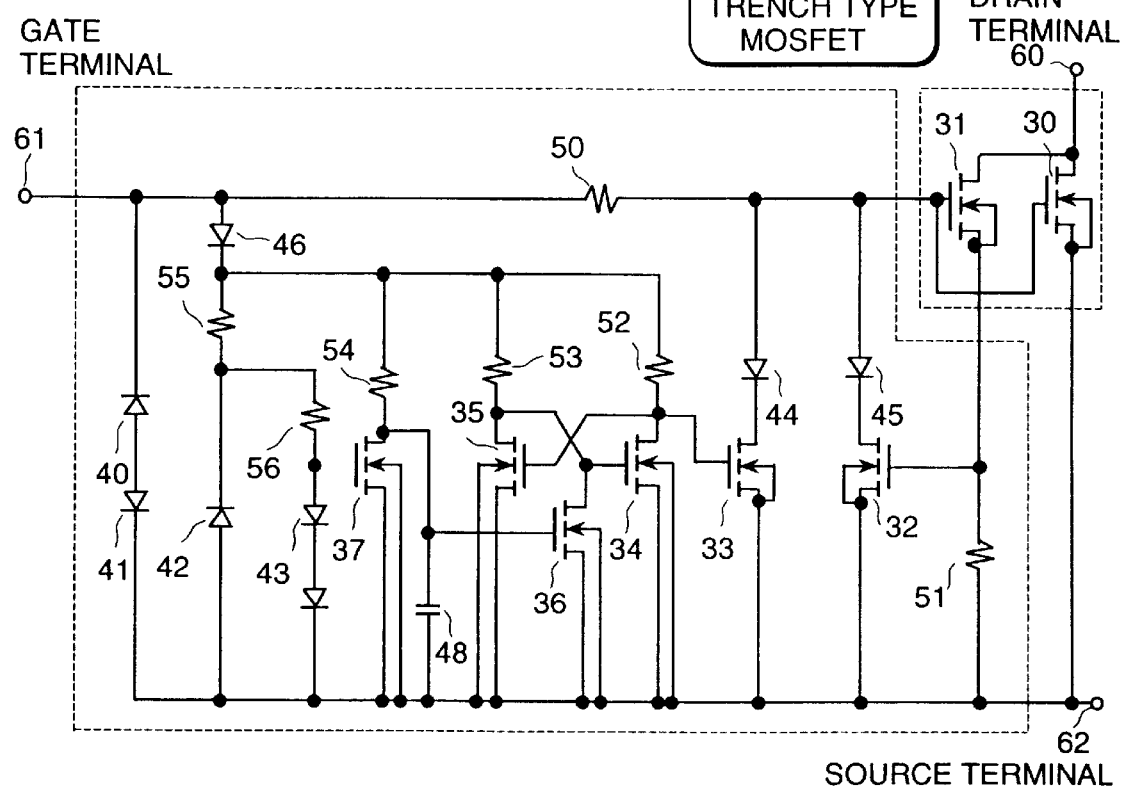
FIG. 8 is a circuit showing the second embodiment of the invention.

The embodiment of an application of an insulated gate type semiconductor device with protection circuit according to the invention to a switching element of a the power switch system is explained in FIG. 8.

The insulated gate type semiconductor device with protection circuit of the embodiment comprise polycrystalline silicon diodes 40~46, a capacitor 48, polycrystalline silicon resistors 50~56, trenches type MOSFETs 30 and 31, and lateral type MOSFETs 32~37. The MOSFET 30 for driving force of a load is connected to the load through a drain terminal 60. The trench type MOSFET 31 has a device structure similar to the MOSFET 30, and chip area of the MOSFET 30 is smaller than the MOSFET 30 such as $1/100$~$1/5000$ of the MOSFET 30, because the MOSFET 31 is an element for current detection. A gate electrode of the MOSFET 30 is connected to a gate terminal 61 through a resistor 50 with the gate of the MOSFET 30. A source electrode of the MOSFET 31 is connected to a source terminal 62 through a resistor 51. The trench type MOSFET 31 constitute an overcurrent protection circuit with the lateral type MOSFET 32 and the resistor 51. Drain current of the MOSFET 31 increases with drain current of the MOSFET 30, when the drain current of the MOSFET 30 superfluously flows. Then, the lateral type MOSFET 32 turns on, when gate voltage (voltage of the resistor 51) of the trench type MOSFET 31 exceeds a setting voltage with increase in the drain current, and gate voltage of the power MOSFET reduces. Therefore, excessive drain current flowing is prevented by the overcurrent protection circuit in the power MOSFET 30.

The diodes 40, 41 are gate protection diodes for protecting the gate of the power MOSFET 30, 31. A diode 42 constitutes a simple constant potential circuit with the resistor 55. The constant potential circuit generates constant voltage in intersection point between the diode 42 which functions as a Zener diode and the resistor 55. The diode 43 comprising several diodes connected in series constitutes temperature detection circuit with the resistor 56 and the lateral type MOSFET 37. The terminal voltage of the diode 43 reduces with increase of chip temperature. The MOSFET 37 changes from ON state to OFF state, when the chip temperature increases over predetermined temperature, and drain voltage of the MOSFET 37 changes in high voltage. The resistor 54 constitutes an inverter with the MOSFET 36. When the temperature detection circuit detects increase of the chip temperature over the predetermined temperature, a drain of the MOSFET 36 becomes low voltage with increase of the drain voltage of MOSFET 37. The resistors 52, 53 and the MOSFET 34, 35 constitute a latch circuit. Drain voltage of the MOSFET 34 increase, when drain voltage of the MOSFET 36 reduces, and the MOSFET 33 turns on. The MOSFET 33 constitutes an shutdown circuit. Since gate voltage of the MOSFET 30, 31 reduces, the MOSFET 30, 31 becomes a shutdown state (off), when the MOSFET 33 becomes on state. In this case, the shutdown state of the power MOSFET 30, 31 is retained, even if the chip temperature reduces under the predetermined temperature, when the shutdown circuit once works by work of the latch circuit. The latch circuit is reset by reduction to 0 volt of voltage of the gate terminal 61 in order to cancel the shutdown state. Still, a resistance value of the resistor 52 in the latching circuit is set at a value higher than resistance value of the resistor 53 on about one digit. Therefore, the MOSFET 33 is always maintained in OFF state, even if the voltage is applied to the gate terminal 61 in room temperature. Consequently, the power MOSFETs 30,31 turn on, when a level of the applied voltage exceeds the threshold voltage.

When the voltage of the gate terminal 61 reduces to a voltage lower than the voltage of the source terminal 62, the diodes 44~46 prevent leakage current which flows from the source terminal 62 in the gate terminal 61 through a parasitic transistor. For example, the parasitic transistor has a collector of the n type epitaxial layer 2, a base of the p type well 3b taking base, and an emitter of the n type diffusion layer 13c. And, the capacitor 48 is provided in order to suppress voltage fluctuation so that the latch circuit has not misoperation by noise from the circuit in circumference.

In the above mentioned overcurrent detection control circuit, the power MOSFETs 30, 31 become an ON state, because the MOSFET 33 is in an OFF state, when the voltage is applied to the gate terminal 61 at room temperature. The drain current of the MOSFET 31 for a current sense increases, when the overcurrent flows for the load in driving the load of the MOSFET 30. Then, the MOSFET 32 becomes an on state, when terminal voltage of the resistor 51 exceeds a predetermined voltage. Therefore, an excessive drain current flowing in the power MOSFET 30 is prevented, because the gate voltage of the power MOSFET 30 reduces.

The MOSFET 37 changes from an on state to an off state, when the chip temperature rises over the regulation temperature in driving the load of the FET 30, and drain voltage of the MOSFET 37 increases. At that time, drain voltage of the MOSFET 36 reduces, and drain voltage of the MOSFET 34 increases, and then the MOSFET 33 becomes an on state. The MOSFET 30 retains the shutdown state, when the power MOSFETs 30, 31 become an off state by this and the chip temperature increases over the predetermined temperature.

In the embodiment, the power MOSFETs 30, 31 and the lateral type MOSFETs 32~37 manufactured by the manufacturing process of the previously mentioned embodiment are used. Therefore, the power MOSFETs 30, 31 has cheap process cost and small power loss, and the lateral type MOSFET 32~37 have small input capacitance and easiness of fining.

According to the embodiment, as the diode 40~46 and the resistor 50~55, and the resistor, the diode using the second silicon layers (11a~11c) are used without addition of process. Therefore, a polycrystalline silicon diode and a polycrystalline silicon resistor having no a parasitic element are formed in a semiconductor device including a trench type power MOSFET and a lateral type MOSFET in low-cost.

A power MOSFET chip has an overcurrent detection control circuit and a temperature detection control circuit in low-cost by the embodiment. Therefore, a power switch system having high reliability is realized, because the power MOSFET is prevented from destroy in an usual overload condition without an outside attachment circuit, for example in use as a switching element of a power switch system in the automobile field.

According to the embodiment, the shutdown state is easily canceled by applying 0 voltage to the gate terminal, when the MOSFET 30 is retained to the shutdown state by chip temperature over the predetermined temperature. Therefore, the power switch system having good usability is realized.

Embodiment 3

Figure 9:
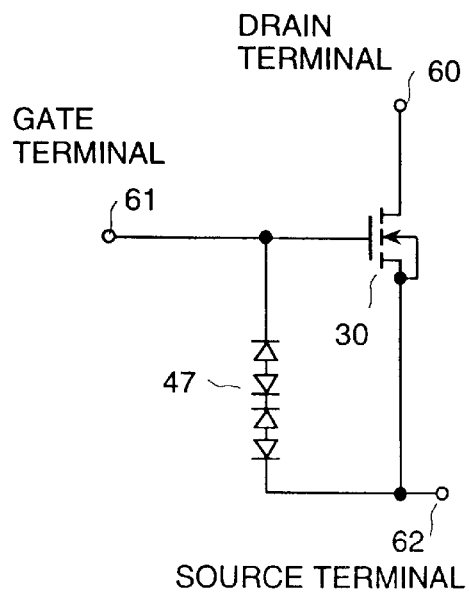
FIG. 9 is a circuit showing the third embodiment of the invention.
Figure 10:
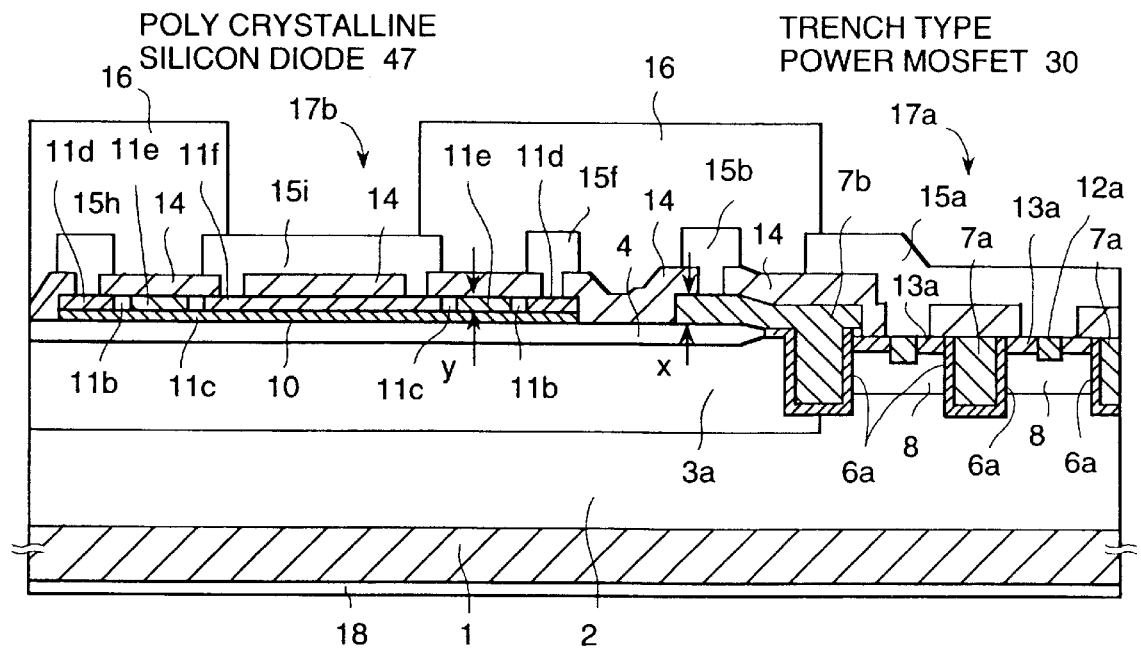
FIGS. 10 is a longitudinal cross section of the semiconductor device shown in FIG. 9.

The embodiment of which an application applied an insulated gate type semiconductor device with protection circuit according to the invention to a circuit including only the gate protective function is explained in FIGS. 9 and 10. FIG. 9 is a circuit structure of a gate protection circuit, and FIG. 10 is a longitudinal cross-section of the insulated gate type semiconductor device with protection circuit. In FIGS. 9 and 10, detailed descriptions of elements in these Figures same as the previously mentioned embodiments are omitted by appending identical numeral codes.

The semiconductor device of the embodiment has a trench type power MOSFET 30 and a polycrystalline silicon diode (gate protection diode) 47. In the MOSFET 30, a drain electrode is connected to a drain terminal 60, a source electrode is connected to a source terminal 62, and a gate electrode is connected to a gate terminal 61. Both ends of the polycrystalline silicon diode 47 in which plural diode elements are connected in back-to-back is connected to the source terminal 62 and the gate terminal 61, respectively. Though the semiconductor device of the embodiment does not include lateral type insulated gate type semiconductor elements for a temperature detection control circuit and an overcurrent detection control circuit, it has the trench type power MOSFET 30 and the polycrystalline silicon diode 47 for protecting the FET 30. The polycrystalline silicon diode 47 having the plural diode elements of the embodiment is provided at the center of a high impurity density n type diffusion layer 11*f*. A low impurity density p type diffusion layer 11*c* is provided around the high impurity density n type diffusion layer 11*f*, and a high impurity density n type diffusion layer 11*e* is provided around a low impurity density p type diffusion layer 11*c*. A low impurity density p type diffusion layer 11*b* is provided around a high impurity density n type diffusion layer 11*e*, and a high impurity density n type diffusion layer 11*d* is provided around the low impurity density p type diffusion layer 11*b*. As a whole, the polycrystalline silicon diode having a ring-shape is constituted. Since the high impurity density p type diffusion layer 11*b* and the anode electrode 15*g* shown in FIGS. 2 and 3 are unnecessary, the polycrystalline silicon diode 47 having a small area prevents an electrostatic destruction of the gate electrode of the power MOSFET 30. A gate electrode 15*i* is provided in center of the diode 47. The gate electrode 15*i* forms a gate pad 17*b* connected to a bonding wire.

It is a feature of the temperature detection control circuit in the embodiment that the source diffusion layer 13*a* and the body (channel) diffusion layer 8 in the power MOSFET 30 are formed after formation of the groove 5. In addition, the silicon layer of the polycrystalline silicon diode 47 is second silicon layers 11*b*–11*f* having thickness y thinner than thickness x of a region in the polycrystalline layer 7*a*, 7*b* extending from the groove 5 (corresponding thickness the polycrystalline silicon layer 7*c* of the lateral type MOSFET 32 shown in FIG. 1).

The concrete manufacturing technique is similar to the polycrystalline silicon diode 44 shown in FIGS. 1 and 3. The thickness y such as 25 nm of the silicon layer in the polycrystalline silicon diode 47 is over 15% thinner than the thickness x of the polycrystalline silicon layer 7*b* such as about 100 nm. Therefore, the source diffusion layer 13*a* of the trench type power MOSFET 30 and the n type cathode diffusion layer 11*d*~11*f* of the polycrystalline silicon diode 47 are formed by an identical process. Consequently, the process cost reduces. Since the n type cathode diffusion layer 11*d*~11*f* do not reach the bottom in the silicon layer when the diode 47 is formed by a silicon layer having the thickness not less than the thickness x of the silicon layer 7*b*, it is the fear that both of the low impurity density p type diffusion layers 11*b* and 11*c* are shorted because of no separation between these p type diffusion layers. Therefore, the n type cathode diffusion layer 11*d*~11*f* are formed by a process different from the process for the formation of the source diffusion layer 13*a*, when the thickness y of the diode 47 is not less than the thickness x. The diode in which four (2 sets) diode element are connected in back-to-back is used as the diode 47 in the embodiment. Between the source terminal 62 and the gate terminal 61, voltage such as ±14 volt is obtained as gate blocking voltage. A six-(3 sets)-back-to-back diode (having six diode elements) is used, when the gate blocking voltage is ±20 volt. In this case, the number of pn junction diodes comprising of the high impurity density n type diffusion layer 11*d*, 11*e* and 11*f* and the low impurity density p type diffusion layer 11*b* and 11*c* increases.

According to the embodiment, process cost is reduced, because the source diffusion layer 13*a* and the n type cathode diffusion layer 11*d*~11*f* are formed by an identical process in a element of the temperature detection control circuit. In addition, the channel-length reduces, because the number of thermal process decreases after the source diffusion layer 13 and the body diffusion layer 8 (channel diffusion layer) are formed. Therefore, the performance of the device is improved, because the power MOSFET 30 has small power loss and small input capacitance.

Embodiment 4

Figure 11:
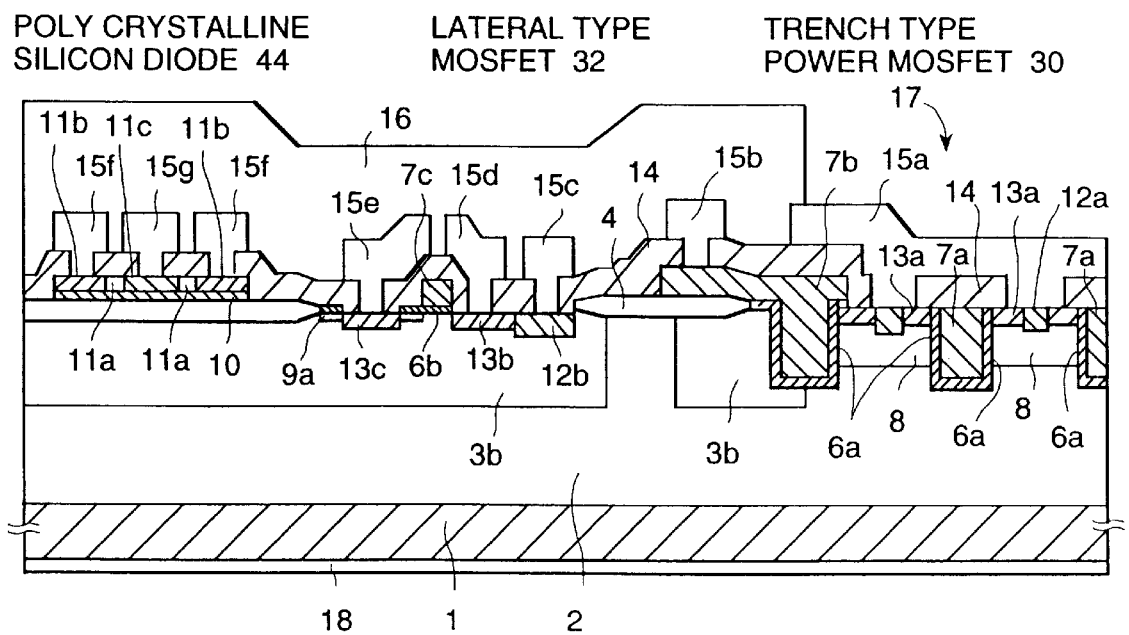
FIG. 11 is a longitudinal cross section showing the fourth embodiment of the invention.

The fourth embodiment of a insulated gate type semiconductor device with protection circuit according to the invention is explained in FIG. 11. In the embodiment, detailed descriptions of elements in the Figure same as the previously mentioned embodiments are omitted by appending identical numeral codes.

Thickness, for example about 80 nm, of a gate oxide film 6*a* of a power MOS transistor 30 in the embodiment is over 15% thicker than thickness (about 50 nm) of a gate oxide film 6*b*.

Figure 12:
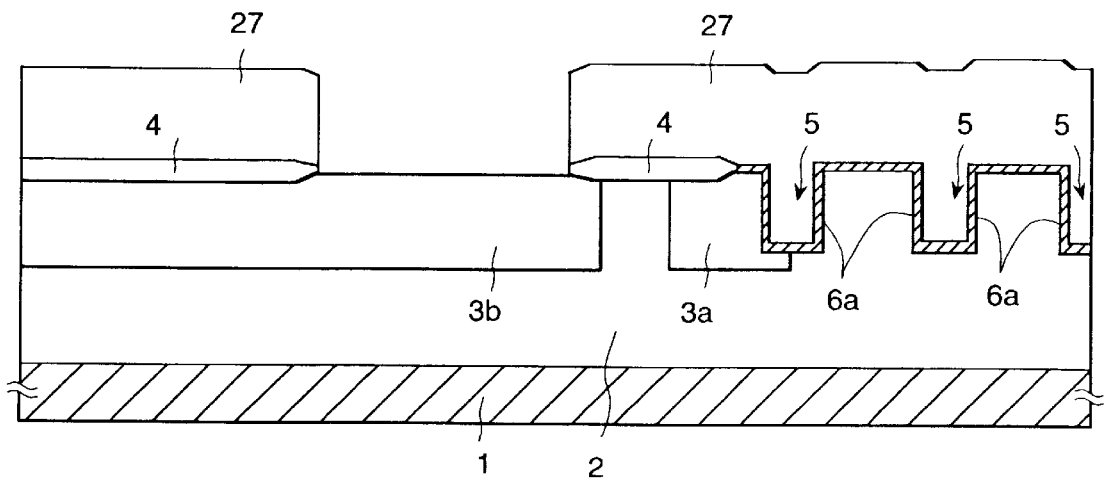
FIG. 12 is a sectional view for explaining a method of manufacturing of the device shown in FIG. 11.

In order to make the gate oxide film 6*a* over 15% thicker than the gate oxide film 6*b*, a gate oxide film 4 formed on an active region in a lateral type MOSFET 32 is removed using a photoresist 27 as a mask after the gate oxide film 6*b* is formed, as shown in FIG. 12. Afterwards, the gate oxide film 6*b* is formed again.

According to the embodiment, degradation of gate blocking voltage of the gate oxide film 6*a* formed in a groove 5, because the film thickness of the gate oxide film 6*a* is thicker than the film thickness of the gate oxide film 6*b*. Therefore, reliability of the gate oxide film 6*a* is improved.

Transconductance gm of the lateral type MOSFET 32 is improved according to the embodiment, because the gate oxide film 6*b* in a flat region where a defect is difficult to form is thinner than the gate oxide film 6*a*.

According to the embodiment, an element having cheap process cost is used similarly to the previously mentioned embodiments. In addition, the power MOSFET 30 having small power loss and small input capacitance is used, and the lateral type MOSFET 32 which is easily fined.

Embodiment 5

Figure 13:
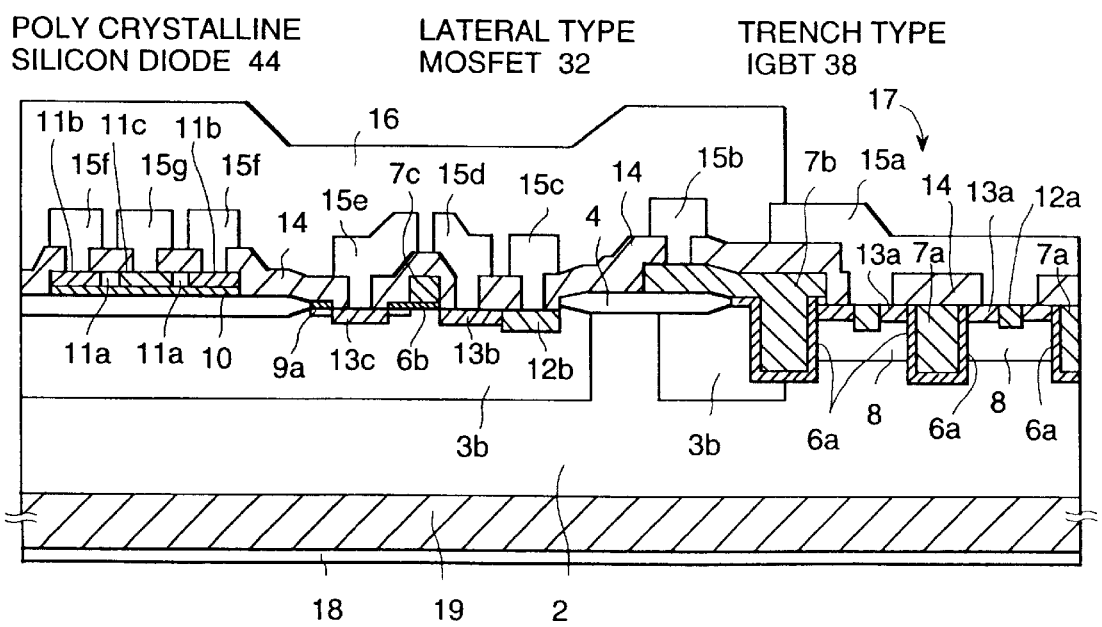
FIG. 13 is a longitudinal cross section showing the fifth embodiment of the invention.

The fifth embodiment of an insulated gate type semiconductor device with protection circuit according to the invention is explained in FIG. 13.

In the embodiment, a high impurity density p type substrate 19 is used instead of the high impurity density n type substrate 1 shown in FIG. 1. In addition, an IGBT 38 is provided instead of the power MOSFET 30 as a insulated gate type power semiconductor element. Since other structures are similar to FIG. 11, detailed descriptions are omitted by appending the identical code.

The IGBT 38, which uses a p type substrate 19 as a collector, n type epitaxial layer 2 as a n type base, a p type diffusion layer as a p type base, n type diffusion layer 13a as an emitter, and polycrystalline silicon layers 7a, 7b as gates, a trench type IGBT.

According to the embodiment, an element having cheap process cost is used similarly to the previously mentioned embodiments. In addition, the IGBT 38 having small power loss and small input capacitance is used, and the lateral type MOSFET 32 which is easily fined.

Embodiment 6

Figure 14:
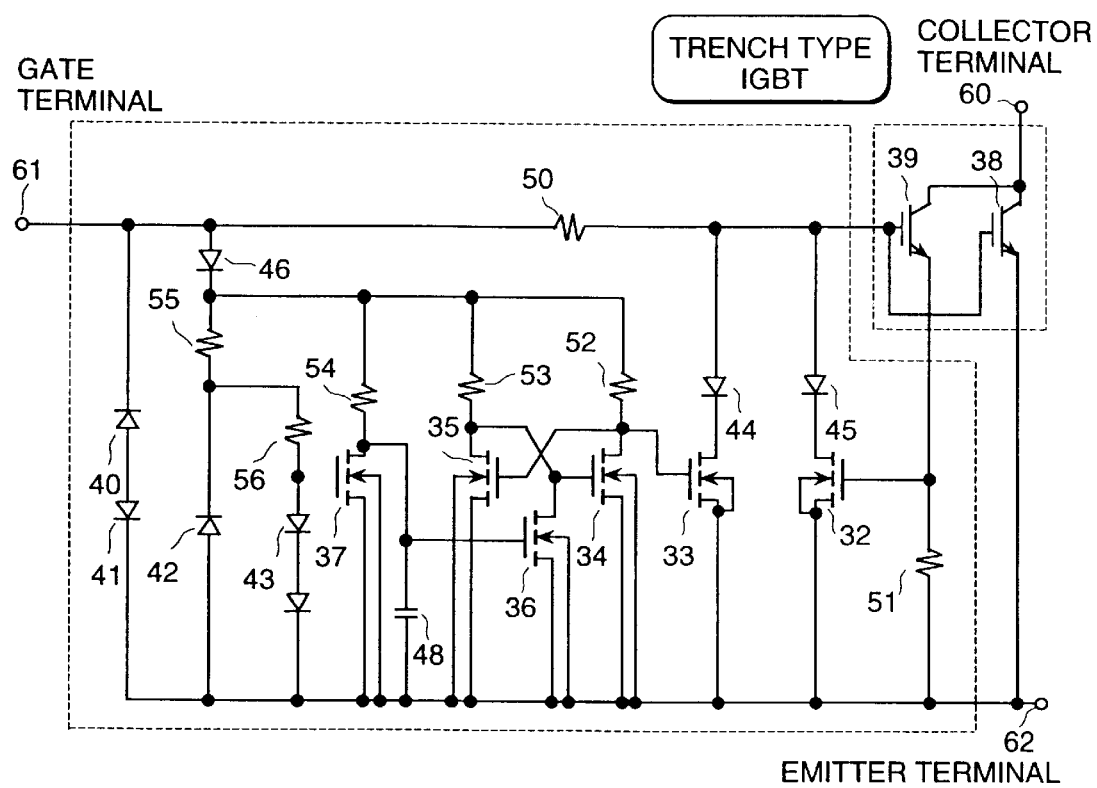
FIG. 14 is a circuit showing the sixth embodiment of the invention.

The sixth embodiment of an insulated gate type semiconductor device with protection circuit according to the invention is explained in FIG. 14. In the embodiment, the semiconductor device shown in FIG. 13 is applied to the insulated gate type semiconductor device having an overcurrent detection control circuit and a temperature detection control circuit. By appending the numeral codes same as FIGS. 8 and 13, the detailed descriptions are omitted.

Trench type IGBTs 38,39 are used in the semiconductor device of the embodiment instead of the power MOSFETs 30,31 shown in FIG. 8. The IGBTs 38,39 have a similar device structure. Area of the IGBT 39 for current detection, such as 1/100~1/5000 of the IGBT 38, is smaller than the IGBT 38.

Polycrystalline silicon diodes 44~46 prevent the leakage current flowing from an emitter terminal 62 to a gate terminal 61 through a parasitic thyristor, when the IGBT38 is used as a power device and voltage of the gate terminal 61 is lower than voltage of an emitter terminal 62. The parasitism thyristor comprises of a n type epitaxial substrate 2, a p type well 3b, a n type diffusion layer 13c, and a p type substrate 19.

According to the embodiment, elements produced using the manufacturing process of the previously mentioned embodiment as the IGBTs 38, 39 and the lateral type MOSFETs 32~37 are used. Therefore, the lateral type MOSFETs 32~37 having small input capacitance and easiness for fining are used, while the IGBTs 38, 39 having cheap process cost and small power loss are used.

According to the embodiment, diodes and resistors using second silicon layers 11a ~11c are used as diodes 40~46 and resistors 50~55 without addition of processes. Therefore, polycrystalline silicon diodes and polycrystalline silicon resistors having no parasitic elements are formed in the semiconductor device including a trench type IGBT and a lateral type MOSFET in low cost.

In addition, according to the embodiment, the overcurrent detection control circuit and the temperature detection control circuit are included in an IGBT chip in low cost. Therefore, destruction of the IGBT in usual overload condition is prevented without an outside attachment circuit, for example in the case of an application to a switching element of a power switch system in the automobile field. Consequently, the power switch system having high reliability is realized.

According to the embodiment, the shutdown state is easily canceled by applying 0 voltage to the gate terminal, when the IGBT is retained to the shutdown state by chip temperature over the predetermined temperature. Therefore, the power switch system having good usability is realized.

Though the suitable embodiments according to the invention are explained in the above descriptions, the invention is not limited to the embodiments. For example, a p channel type is used instead of a n channel type as a power MOSFET or an IGBT, and an amorphous silicon and a single crystal silicon are used as a silicon on a insulating layer though a polycrystalline silicon is explained in the embodiment. In addition, a combination of the semiconductor devices in the embodiments it formed in an identical chip.

As mentioned above, according to the invention, depth of a diffusion layer (a source diffusion layer in a power MOSFET, an emitter diffusion layer in an IGBT) connected a third electrode of a trench type insulated gate semiconductor element is set to depth not larger than depth of a lateral type insulated gate semiconductor element in a semiconductor device in which the trench type insulated gate semiconductor element and the lateral type insulated gate semiconductor element are provided in an identical chip. Therefore, capacitance between electrodes is reduced. In the lateral type insulated gate semiconductor element, fining and reduction of chip area are possible, since effective channel length reduces and mutual conductance easily increases. In the trench type insulated gate semiconductor element, power loss reduces, since channel length reduces. In addition, film thickness of a diode is thinner than film thickness of a gate layer region in the insulated gate semiconductor element, when the trench type insulated gate semiconductor element and the diode are formed in an identical chip. Therefore, the diffusion layer connected to the third electrode of the trench type insulated gate semiconductor element and a diffusion layer for a cathode of the diode are formed by an identical process. Consequently, the performance is improved, because the trench type insulated gate semiconductor element having small power loss and small input capacitance is used, while process cost is reduced.

A body diffusion layer and the diffusion layer connected to the third electrode are formed in a groove after forming the groove in a main surface of a semiconductor layer, when the trench type insulated gate semiconductor element and the lateral type insulated gate semiconductor element are formed in an identical chip. Therefore, the capacitance between electrodes is reduced and the channel-length of trench type insulated gate semiconductor element is reduced, because it is prevented that a source diffusion layer, an emitter diffusion layer and a channel diffusion layer become deep in thickness under a high temperature and long-time thermal process in forming the groove. Therefore, power loss is reduced.

When the trench type insulated gate semiconductor element and the lateral type insulated gate semiconductor element are formed in an identical chip, plural grooves are formed in a main surface of a semiconductor layer. Afterwards, the diffusion layer connected to the third electrodes is formed in the groove and a source diffusion layer of the lateral type insulated gate type semiconductor element is formed by an identical process. Therefore, the number of processes and the number of masks are reduced, respectively. Consequently process cost is reduced.

What is claimed is:

1. An insulated gate type semiconductor device comprising:
   a trench type insulated gate semiconductor element;
   a lateral type insulated gate semiconductor element concerning an operation of said trench type insulated gate semiconductor element,
   said trench type insulated gate semiconductor element including plural grooves provided in a main surface of a semiconductor layer in a semiconductor substrate, a gate layer connected to a first electrode, said gate layer being provided inside of said grooves through a gate insulating film, a second electrode provided on a surface of said semiconductor layer opposite to said main surface, and a diffusion layer connected to a third electrode, said diffusion layer being provided between each said gate layer, said lateral type insulated gate semiconductor element including a main gate layer connected to a gate electrode, said main gate layer being provided on said semiconductor layer in said semiconductor substrate through another gate insulating film, and a drain diffusion layer connected to a drain electrode and a source diffusion layer connected to a source electrode which are provided in regions of said semiconductor layer between which a region facing said main gate layer is put, wherein depth of said diffusion layer connected to said third electrode is not greater than depth of said source diffusion layer of said lateral type insulated gate semiconductor element.

2. An insulated gate type semiconductor device as in claim 1, wherein said gate insulating film of said trench type insulated gate semiconductor element is thicker than said another gate insulating film of said lateral type insulated gate semiconductor element.

3. An insulated gate type semiconductor device as in claim 2, further comprising an insulating film provided on said main surface of said semiconductor layer in said semiconductor substrate, and plural silicon layers of a diode which are provided on said insulating film, said plural silicon layers having film thickness smaller than that of said gate layer of said lateral type insulated gate semiconductor element and different conductivity type.

4. An insulating gate type semiconductor device as in claim 2, further comprising an insulating film provided on said main surface of said semiconductor layer in said semiconductor substrate, wherein a silicon layer of a resistor is provided on said insulating film, said silicon layer having film thickness smaller than that of said gate layer of said lateral type insulated gate semiconductor element.

5. An insulating gate type semiconductor device as in claim 2, further comprising an insulating film provided on said main surface of said semiconductor layer in said semiconductor substrate, wherein a silicon layer of a capacitor is provided on said insulating film, said silicon layer having film thickness smaller than that of said gate layer of said lateral type insulated gate semiconductor element, said capacitor having an electrode connected to said gate layer of said lateral type insulated gate semiconductor element and an electrode connected to said silicon layer.

6. An insulated gate type semiconductor device as in claim 1, further comprising an insulating film provided on said main surface of said semiconductor layer in said semiconductor substrate, and plural silicon layers of a diode which are provided on said insulating film, said plural silicon layers having film thickness smaller than that of said gate layer of said lateral type insulated gate semiconductor element and different conductivity type.

7. A method of manufacturing an insulated gate type semiconductor device as in claim 6 comprising:
forming plural grooves in a main surface of a semiconductor layer in said semiconductor substrate;
forming a gate layer for connection of said first electrode inside of said grooves through a gate insulating film;
forming a body diffusion layer between each said gate layer; and then forming a diffusion layer for connection of said third electrode and a cathode or anode layer for said diode in an identical process.

8. An insulating gate type semiconductor device as in claim 1, further comprising an insulating film provided on said main surface of said semiconductor layer in said semiconductor substrate, wherein a silicon layer of a resistor is provided on said insulating film, said silicon layer having film thickness smaller than that of said gate layer of said lateral type insulated gate semiconductor element.

9. An insulating gate type semiconductor device as in claim 1, further comprising an insulating film provided on said main surface of said semiconductor layer in said semiconductor substrate, wherein a silicon layer of a capacitor is provided on said insulating film, said silicon layer having film thickness smaller than that of said gate layer of said lateral type insulated gate semiconductor element, said capacitor having an electrode connected to said gate layer of said lateral type insulated gate semiconductor element and an electrode connected to said silicon layer.

10. An insulating gate type semiconductor device as in claim 1, further comprising an overcurrent detection control circuit suppressing output current of said trench type insulated gate semiconductor element when value of said output current is excessive, wherein said overcurrent detection control circuit including said lateral type insulated gate semiconductor element as a main element is provided in said semiconductor substrate.

11. A power switch system comprising:
a insulated gate type semiconductor device as in claim 10 as a driving force which drives a load;
said switch system suppressing output current of said trench type insulated gate semiconductor element, when said output current value of said trench type insulated gate semiconductor element becomes excessive with overload, or when temperature of said semiconductor layer increases over a pre-determined temperature.

12. An insulating gate type semiconductor device as in claim 1, further comprising a temperature detection control circuit suppressing output current of said trench type insulated gate semiconductor element when temperature of said semiconductor layer is larger than a predetermined temperature, wherein said temperature detection control circuit including said lateral type insulated gate semiconductor element as a main element is provided in said semiconductor substrate.

13. A power switch system comprising:
a insulated gate type semiconductor device as in claim 12 as a driving force which drives a load;
said switch system suppressing output current of said trench type insulated gate semiconductor element, when said output current value of said trench type insulated gate semiconductor element becomes excessive with overload, or when temperature of said semiconductor layer increases over a pre-determined temperature.

14. A method of manufacturing an insulated gate type semiconductor device as in claim 1, comprising:
forming plural grooves in a main surface of a semiconductor layer in said semiconductor substrate;
forming a gate layer for connection of said first electrode inside of said grooves through a gate insulating film;
forming a body diffusion layer between each said gate layer; and
then forming a diffusion layer for connection of said third electrode.

15. A method of manufacturing an insulated gate type semiconductor device as in claim 11, further comprising a step of forming said gate layer for said trench type insulated gate semiconductor element and a gate layer for said lateral type insulated gate semiconductor element in an identical process.

16. A method of manufacturing an insulated gate type semiconductor device as in claim 1 comprising:

forming plural grooves in a main surface of a semiconductor layer in said semiconductor substrate;

forming a gate layer for connection of said first electrode inside of said grooves through a gate insulating film;

forming a body diffusion layer between each said gate layer; and then forming a diffusion layer for connection of said third electrode and a source diffusion layer for said lateral type insulated gate semiconductor element in an identical process.

17. A method of manufacturing an insulated gate type semiconductor device as in claim 16, further comprising a step of forming said gate layer for said trench type insulated gate semiconductor element and a gate layer for said lateral type insulated gate semiconductor element in an identical process.

18. An insulated gate type semiconductor device comprising:

a trench type insulated gate semiconductor element;

a diode concerning a gate-protection of said trench type insulated gate semiconductor element, said trench type insulated gate semiconductor element including plural grooves provided in a main surface of a semiconductor layer in a semiconductor substrate, gate layers connected to a first electrode which are provided inside and outside of said grooves through a gate insulating film, a second electrode provided on a surface of said semiconductor layer opposite to said main surface, and a diffusion layer connected to a third electrode, said diffusion layer being provided between said gate layers, said gate layers having gate layer regions on said grooves and another gate layer regions extending to said outside of said groove, said first electrode being connected to said first electrode on said another gate layer regions extending to said outside of said groove, said diode being provided on an insulating film on said main surface of said semiconductor layer in said semiconductor layer, said diode having film thickness smaller than that of said another gate layer regions extending to said outside of said groove for connection of said first electrode and said gate layer.

19. An insulated gate type semiconductor device as in claim 18, wherein said trench type insulated semiconductor element is a MOSFET, depth of said MOSFET's source diffusion layer connected to said MOSFET's source electrode is not greater than depth of said source diffusion layer of said lateral type insulated gate semiconductor element.

20. An insulated gate type semiconductor device as in one of claim 18, wherein said trench type insulated semiconductor element is an IGBT, depth of said emitter diffusion layer is not greater than depth of said source diffusion layer of said lateral type insulated gate semiconductor element.

21. A method of manufacturing an insulated gate type semiconductor device as in claim 18, comprising:

forming plural grooves in a main surface of a semiconductor layer in said semiconductor substrate;

forming a gate layer for connection of said first electrode inside of said grooves through a gate insulating film;

forming a body diffusion layer between each said gate layer; and then forming a diffusion layer for connection of said third electrode.

22. A method of manufacturing an insulated gate type semiconductor device as in claim 18 comprising:

forming plural grooves in a main surface of a semiconductor layer in said semiconductor substrate;

forming a gate layer for connection of said first electrode inside of said grooves through a gate insulating film;

forming a body diffusion layer between each said gate layer; and then forming a diffusion layer for connection of said third electrode and a source diffusion layer for said lateral type insulated gate semiconductor element in an identical process.

23. A method of manufacturing an insulated gate type semiconductor device as in claim 18 comprising:

forming plural grooves in a main surface of a semiconductor layer in said semiconductor substrate;

forming a gate layer for connection of said first electrode inside of said grooves through a gate insulating film;

forming a body diffusion layer between each said gate layer; and then forming a diffusion layer for connection of said third electrode and a cathode or anode layer for said diode in an identical process.

* * * * *